United States Patent
Sood et al.

(10) Patent No.: US 11,674,851 B1
(45) Date of Patent: Jun. 13, 2023

(54) HIGH-PERFORMANCE MICROBOLOMETER USING VOX, CNT AND GRAPHENE FOR LONGWAVE INFRARED (LWIR) APPLICATIONS

(71) Applicant: Magnolia Optical Technologies, Inc., Woburn, MA (US)

(72) Inventors: Ashok K. Sood, Brookline, MA (US); John W. Zeller, Woburn, MA (US)

(73) Assignee: Magnolia Optical Technologies, Inc., Woburn (MA)

( * ) Notice: Subject to any disclaimer, the term of this patent is extended or adjusted under 35 U.S.C. 154(b) by 0 days.

(21) Appl. No.: 17/400,052

(22) Filed: Aug. 11, 2021

Related U.S. Application Data

(60) Provisional application No. 63/064,245, filed on Aug. 11, 2020.

(51) Int. Cl.
*G01J 5/20* (2006.01)
*H01L 37/02* (2006.01)

(52) U.S. Cl.
CPC .............. *G01J 5/20* (2013.01); *H01L 37/025* (2013.01)

(58) Field of Classification Search
CPC .................. G01J 5/20; H01L 37/025
See application file for complete search history.

(56) References Cited

U.S. PATENT DOCUMENTS 10,184,839 B1* 1/2019 Brown .................. C23C 14/165
2011/0315981 A1* 12/2011 Xu .......................... G01J 5/046
438/54

OTHER PUBLICATIONS

Sood et al., "A Review of Growth, Functionalization, and use of Graphene for Detection Applications", International Journal of NanoScience and Nanotechnology, ISSN 0974-3081, vol. 5, No. 2, 2014, pp. 133-150.
Sood et al., "Nanostructured Detector Technology for Optical Sensing Applications", http://dx.doi.org/10.5772/58349, Optical Sensors, 2014, 44 pages.
Sood et al., "Review of Graphene Technology and Its Applications for Electronic Devices", http://dx.doi.org/10.5772/61316, Optical Sensors, 2015, 31 pages.

* cited by examiner

*Primary Examiner* — Hugh Maupin
(74) *Attorney, Agent, or Firm* — Loginov & Associates. PLLC; William A. Loginov

(57) ABSTRACT

A high-performance Microbolometer that incorporates vanadium oxide (VOx) along with carbon nanotubes (CNTs) or graphene. This Microbolometer, which uses a microbridge comprising Si3N4 and VOx, provides low noise and high dynamic range longwave infrared (LWIR) band detection. Addition of CNTs/graphene provides a high level of performance [low 1/f noise, noise equivalent temperature difference (NETD), and thermal time constant] due to the high temperature coefficient of resistance (TCR) of these materials.

20 Claims, 14 Drawing Sheets

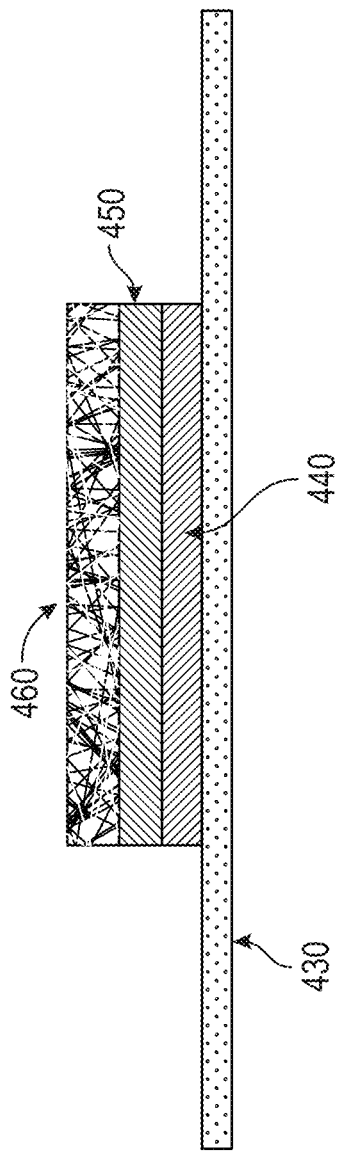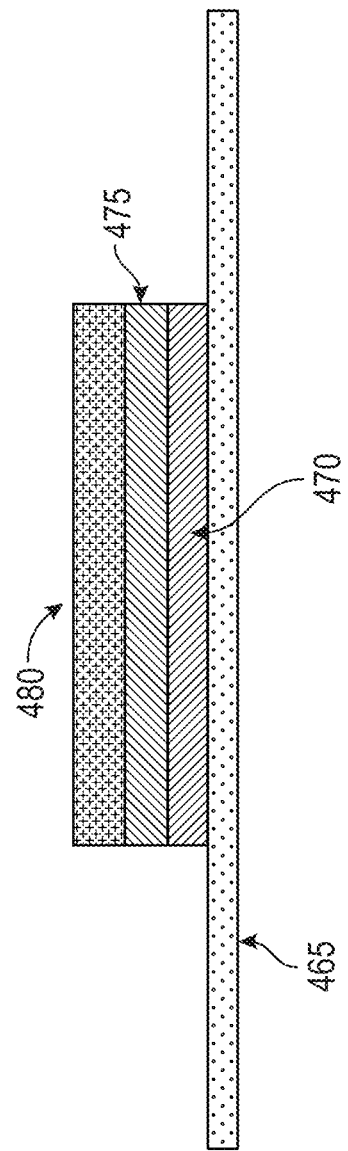

HIGH-PERFORMANCE MICROBOLOMETER USING VOX, CNT AND GRAPHENE FOR LONGWAVE INFRARED (LWIR) APPLICATIONS

RELATED APPLICATIONS

This application claims the benefit of U.S. Provisional Application Ser. No. 63/064,245, filed Aug. 11, 2020, entitled HIGH-PERFORMANCE MICROBOLOMETER USING VOX, CNT AND GRAPHENE FOR LONGWAVE INFRARED (LWIR) APPLICATIONS, the entire disclosure of which is herein incorporated by reference.

STATEMENT REGARDING FEDERALLY SPONSORED RESEARCH OR DEVELOPMENT

This invention was made with U.S. government support under Grant Number W31P4Q-19-C-0008 awarded by Defense Advanced Research Project Agency (DOD). The government has certain rights in this invention.

FIELD OF THE INVENTION

A high-performance Microbolometer that incorporates vanadium oxide (VOx) along with carbon nanotubes (CNTs) or graphene. This Microbolometer, which uses a microbridge comprising Si3N4 and VOx, provides low noise and high dynamic range longwave infrared (LWIR) band detection. Addition of CNTs/graphene provides a high level of performance [low 1/f noise, noise equivalent temperature difference (NETD), and thermal time constant] due to the high temperature coefficient of resistance (TCR) of these materials.

BACKGROUND OF THE INVENTION

Microbolometer-based sensors are required for a variety of Defense and Commercial Systems Applications. Microbolometers based on the Si-MEMS device structure have been under development for over 20 years. FIG. 1A presents an illustration of an uncooled microbolometer structure with individual pixel and array configuration. FIG. 1B shows the plot between responsivity as a function of bias voltage, whereby it is seen that the responsivity of these devices increases with bias voltage.

The two most common Si-MEMS-based structures, which have been developed and produced by several defense contractors, utilize VOx and amorphous silicon based technologies. These include small microbolometer unit cell arrays with 640×480 and larger configurations using vanadium oxide (VOx), as described in R. Blackwell, D. Lacroix, T. Bach et al. "17-micron microbolometer FPA Technology at BAE Systems." Proceedings of SPIE, Volume 7298, 72980P (2009) and C. Li, G. Skidmore, C. Howard, E. Clarke and J. Han, "Advancement in 17-micron pixel pitch uncooled focal plane arrays." Proceedings of SPIE, Volume 7298, 72980S (2009), as well as amorphous silicon microbolometer technologies that feature comparable array formats and 17 µm unit cells, as described in T. Schimert, C. Hanson, J. Brady et. al. "Advanced in small-pixel, large-format alpha-silicon bolometer arrays." Proceedings of SPIE, Volume 7298, 72980T (2009) and C. Trouilleau, B. Fieque, S. Noblet, F. Giner et. al. "High Performance uncooled-amorphous silicon TEC less XGA IRFPA with 17-micron pixel pitch." Proceedings of SPIE, Volume 7298, 72980Q, (2009), the teachings of each of which are hereby incorporated by reference as useful background.

A primary goal in achieving high microbolometer performance is to take advantage of the high temperature-dependent nonlinearity in the change of resistance. Charge transport in an ensemble of a carbon nanotubes (CNTs) is expected through tunneling. Furthermore, the probability of this tunneling increases exponentially, thus allowing for demonstrated increase in the temperature coefficient of resistance (TCR) by a factor 10. This is very significant for the development of higher performance bolometer arrays.

FIGS. 2A and 2B respectively show the growth of multiwall CNTs for bolometer application along with TCR measurements. For bolometer applications, a random mat of CNTs provides improvement in the TCR, and this type of CNT configuration is also much easier for future implementation in the product line.

FIGS. 3A and 3B show the temperature maps of a CNT bolometer pixel for different types of CNT networks. The net absorbed power is assumed to be 1 nW, and the pixel is tightly packed with the CNTs. The entire pixel's temperature map is obtained with 100×100 temperature resolution. For the CNTs, two different thermal resistance values were used: $5 \times 10^8$ and $1 \times 10^9$ K/W, as described by A. K. Sood, N. K. Dhar, P. Wijewarnasuriya et al. "Nanostructure detector technology for Optical Sensing Applications." Book Chapter, Intech Publications (2015), the teachings of which are hereby incorporated by reference as useful background.

As expected, a higher thermal resistance results in a greater temperature difference from the ambient. It is noted that in general the thermal resistance also rises with increasing temperature, resulting in further heating of hot spots. The color-mapped temperature gradients of the contact legs that connect the film to the readout integrated circuit (ROIC) can be clearly seen in FIGS. 3A and 3B.

The high mobility of graphene occurs due to electron delocalization and weak electron phonon interaction, making graphene an ideal material for electrical applications requiring high mobility and fast response times, as describe by A. K. Sood, N. K. Dhar, J. S. Lewis, P. Wijewarnasuriya et al. "Review of Graphene Technology for Electronic Devices." Chapter in Book by Intech Publications (2015) and A. K. Sood, H. Efstathiadis, N. K. Dhar, P. Wijewarnasuriya, M. Dubey et al. "A Review of growth, functionalization and use of Graphene for Detection Applications." International Journal of Nanoscience and Nanotechnology, Volume 5, P133-150 (2015), the teachings of each of which are hereby incorporated by reference as useful background. FIGS. 4A-4C present a schematic of the structure for determination of the graphene characteristics.

The electrical properties required for application of VOx/CNT/Graphene composite films for the microbolometer array technology are determined by the design requirements of the detector arrays and readout electronics. In general, high TCR with low 1/f noise is desired at a pixel resistance range dictated by ROIC design and bias scheme.

U.S. Pat. No. 9,851,257, issued Dec. 26, 2017 to Sood et al., the teachings of which are hereby incorporated by reference, describes Si3N4 films being alternated with CNT-graphene layers forming a type of nanocomposite for thermal sensing for optimal IR detection, where VOx was likewise incorporated as a radiation sensing element. In this regard, a separate layer of Si3N4 is additionally incorporated as an insulating bridge material and the thermal sensing is achieved using a composite CNT-graphene-Si3N4-VOx nanocomposite layer structure.

SUMMARY OF THE INVENTION

The present invention overcomes the disadvantages of the prior art by providing a high-performance Microbolometer that includes using CNTs or graphene along with VOx to improve the TCR, noise level, and dynamic range. Microbolometer technology today typically utilizes a microbridge that is made up of Si3N4 and VOx with good performance. The addition of CNTs and graphene to VOx enables higher longwave infrared (LWIR) band microbolometer focal plane array performance, including lower 1/f noise and noise, NETD, and thermal time constant. The optimized VOx/CNT/Graphene device may achieve 3%/K to 5%/K TCR and 1/f noise Hooge parameter $\alpha_H/p \approx 1 \times 10^{-24}$ cm$^3$, enabling a noise equivalent temperature difference (NETD) below 25 mK for 17 µm pitch and 12 µm LWIR focal plane arrays.

The resistivity of VOx/CNT/Graphene composite will be lower than that of VOx allowing use of thinner composite films for the same pixel resistance. A composite film thickness of ¾ to ½ the thickness of current VOx bolometer pixels results similar reduction in pixel mass. Also, the density of the composite film is lower than the VOx film density, further reducing the mass of the composite film pixel. This approach enables a thermal time constant for 17 µm pitch arrays of below 10 ms, less than half that of current VOx microbolometer pixels, for the present invention.

BRIEF DESCRIPTION OF THE DRAWINGS

The invention description below refers to the accompanying drawings, of which:

FIG. 4B is a cross-sectional view of a CNT-based microbolometer, featuring layer of CNTs grown on layer of VOx, deposited in turn on Si$_3$N$_4$ bridge layer on a Si substrate;

FIG. 4C is a cross-sectional view of a graphene-based microbolometer, featuring layer of graphene on layer of VOx, grown on Si$_3$N$_4$ bridge layer on a Si substrate;

DETAILED DESCRIPTION

Figure 1A:
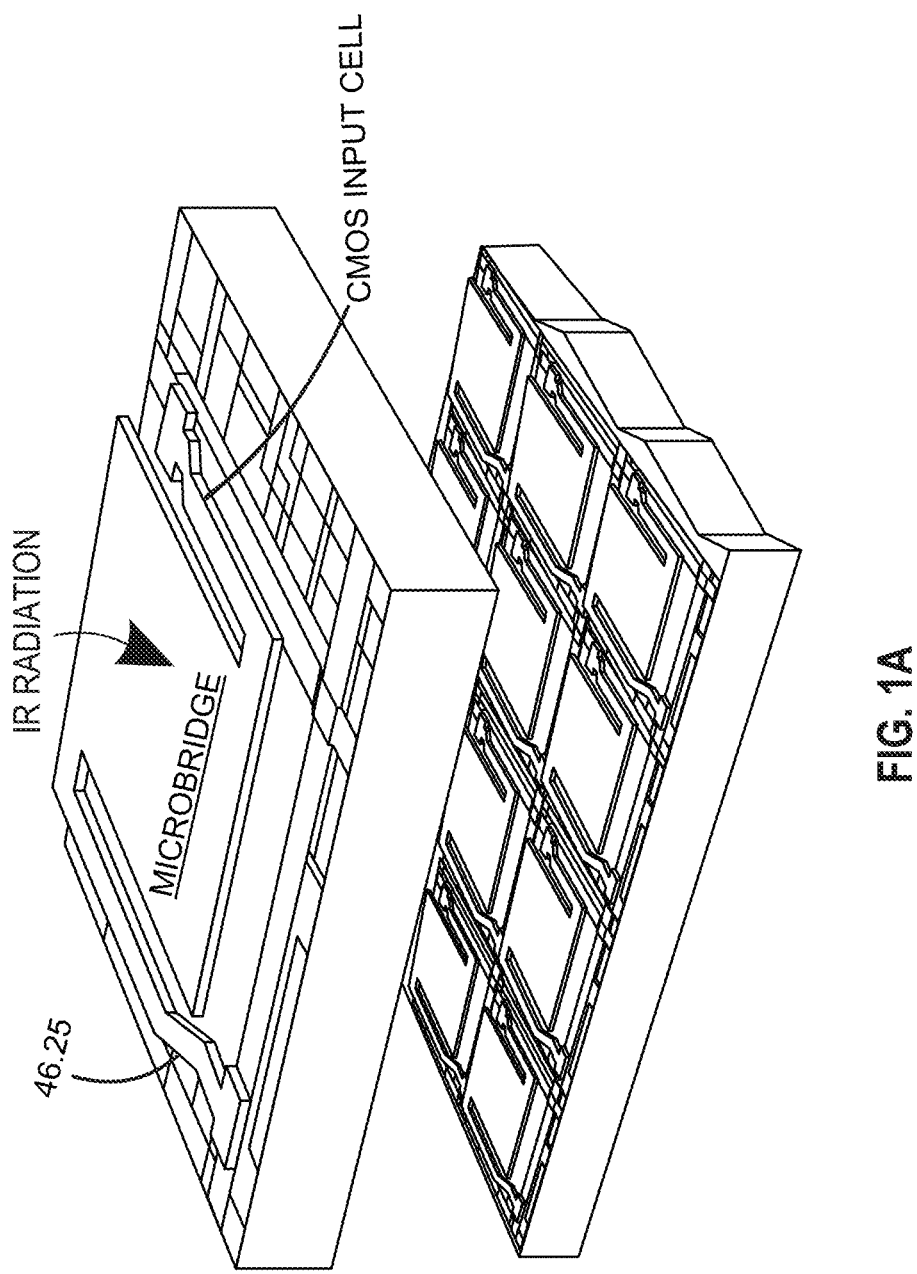
FIG. 1A is an illustration of uncooled microbolometer structure with individual pixel and the array configuration
Figure 1B:
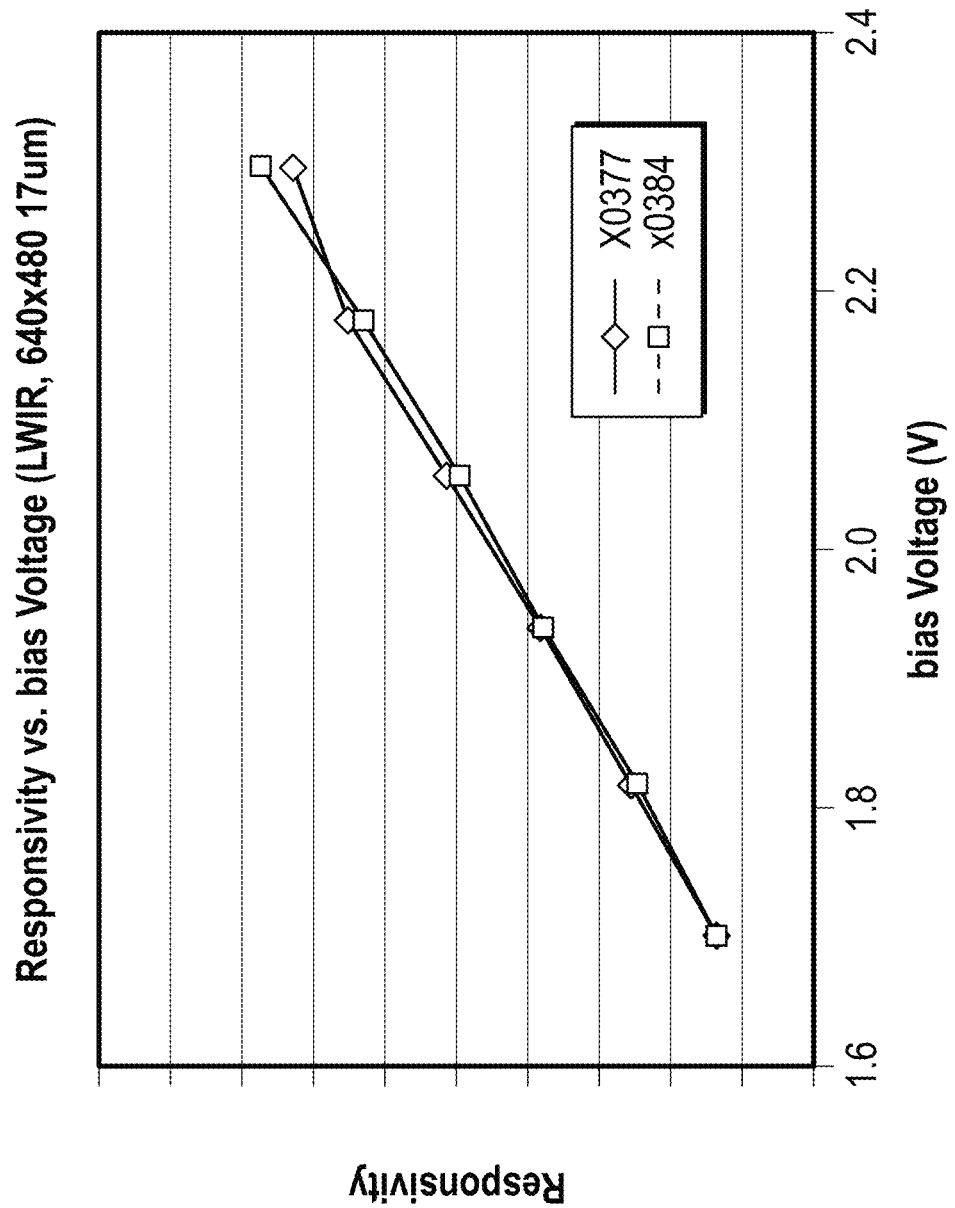
FIG. 1B is a graph depicting responsivity as a function of the bias voltage.
Figure 2A:
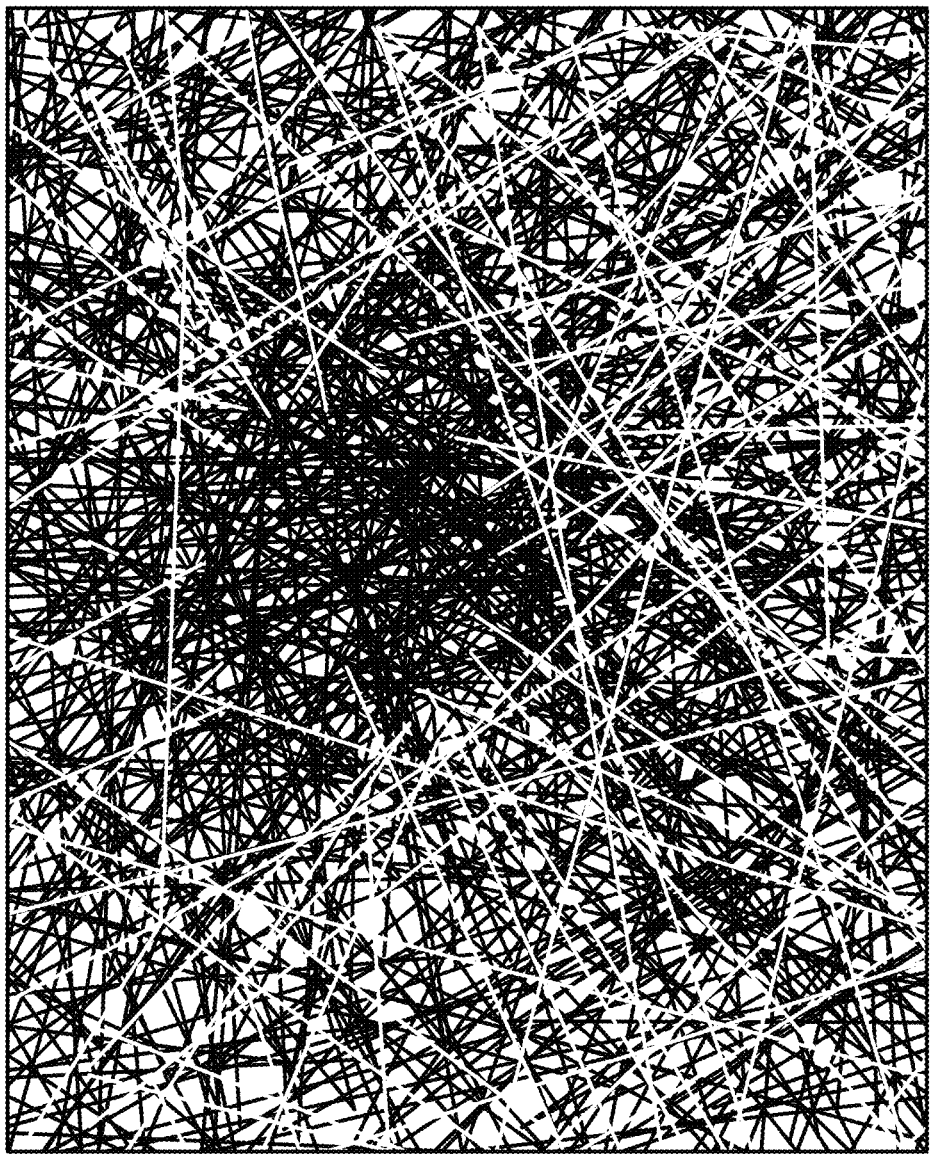
FIG. 2A depicts growth of multiwall CNTs with good length/diameter uniformity.
Figure 2B:
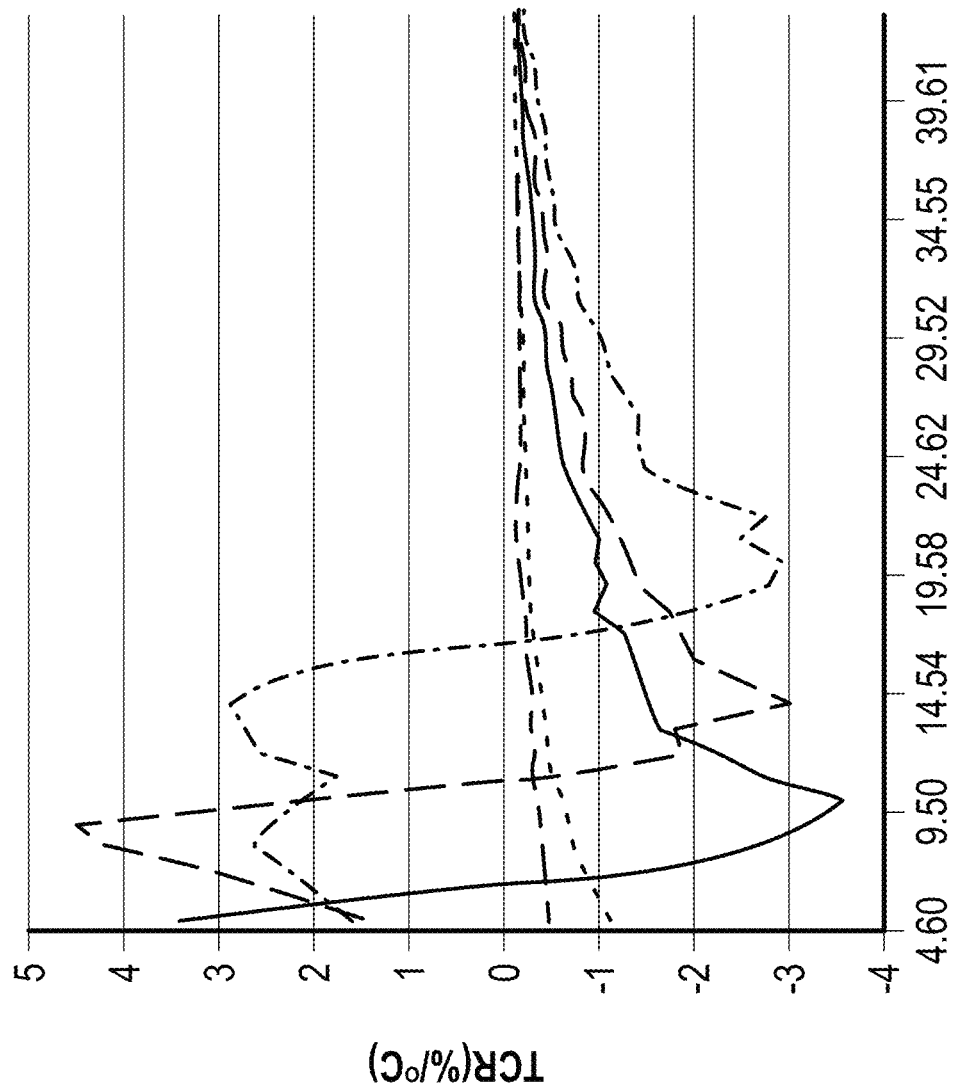
FIG. 2B is a graph depicting reflectivity measurements for multiwalled CNTs along with preliminary results on TCR measurements.
Figure 3A:
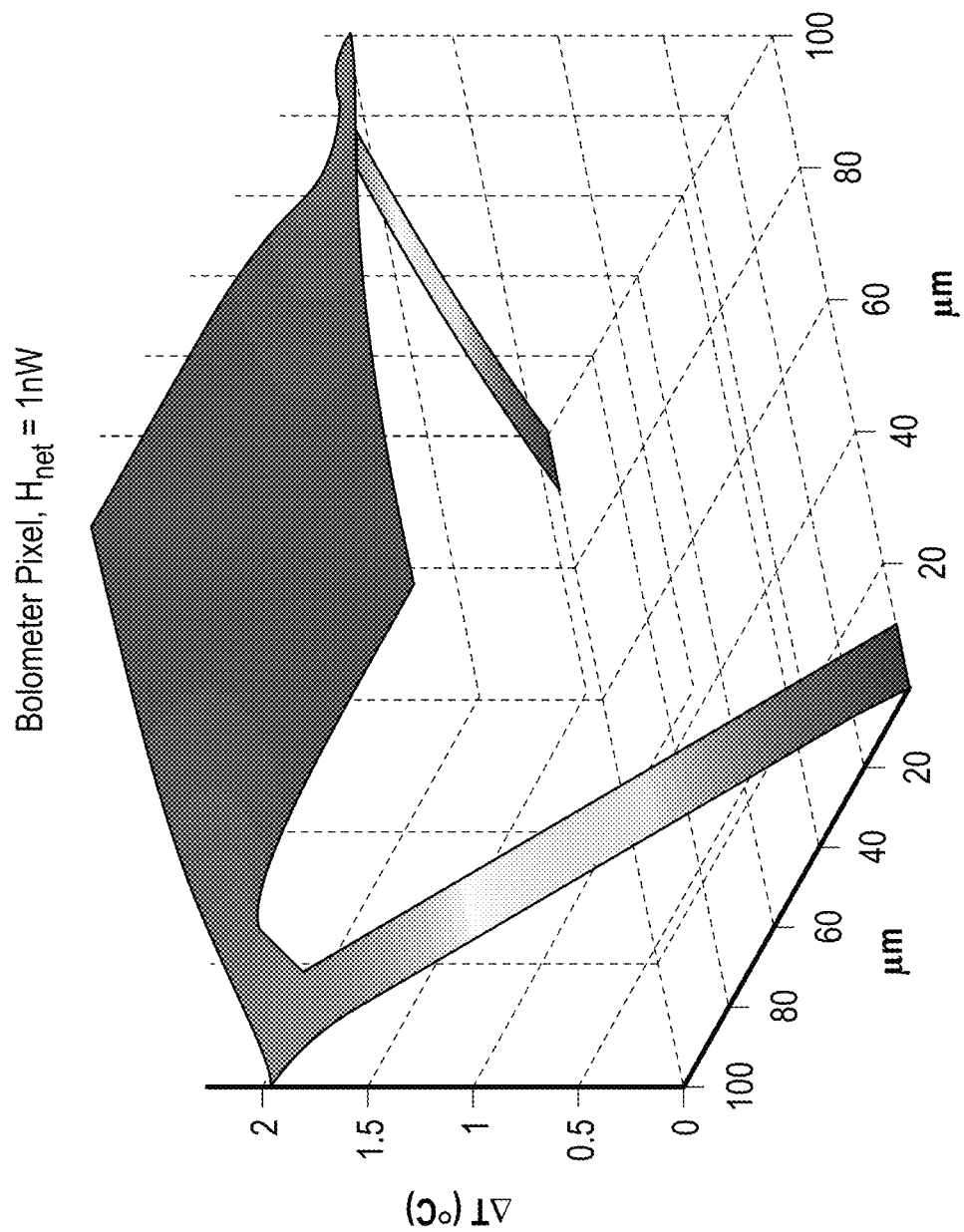
FIG. 3A is a three-dimensional temperature map of a bolometer pixel when the net absorbed power is 1 nW, and the CNT thermal resistance is 5×108 K/W. It is assumed that the pixel is tightly packed with the CNTs. The temperature gradient of the contacts is connected to the ROIC.
Figure 3B:
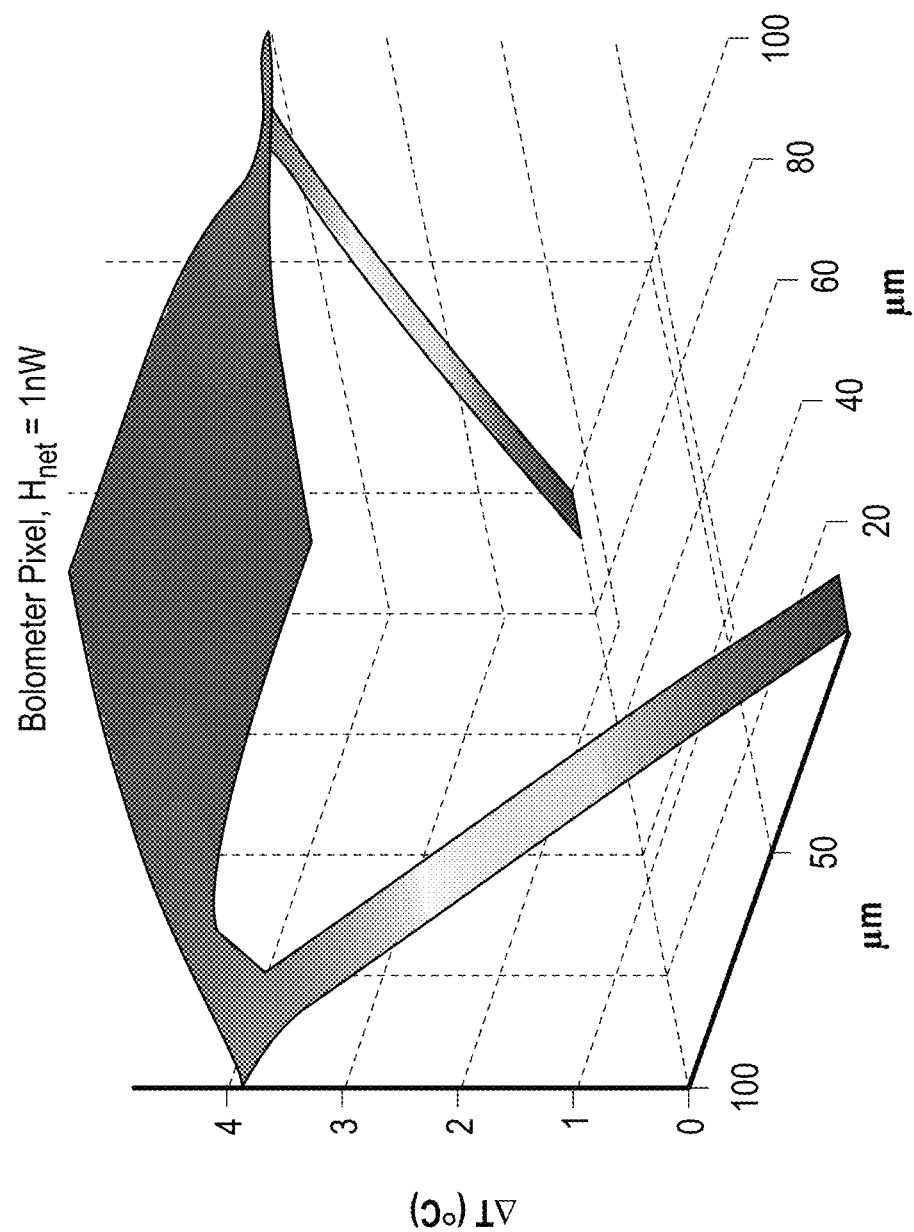
FIG. 3B is a three-dimensional temperature map of a bolometer pixel when the net absorbed power is 1 nW, and the CNT thermal resistance is 1×109 K/W. It is assumed that the pixel is tightly packed with the CNTs. The temperature gradient of the contacts is connected to the ROIC.
Figure 4A:
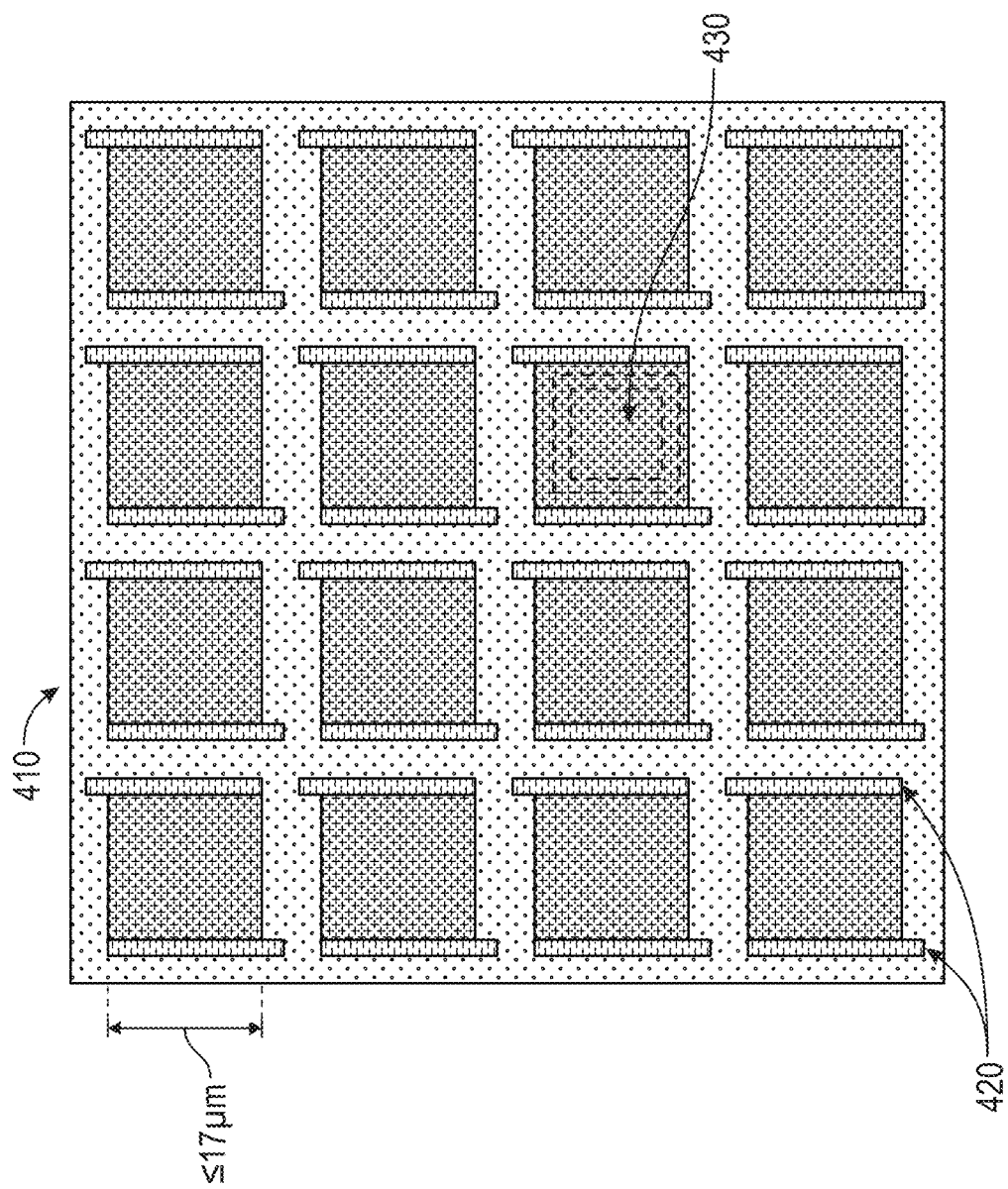
FIG. 4A is a top view schematic of a high-performance 17 µm pitch or smaller CNT/graphene-based microbolometer array on Si wafer substrate. The two side contacts connections adjoining the graphene/CNT microbridge sensing element provide electrical addressing of each microbolometer pixel featuring VOx and Si$_3$N$_4$ layers.

FIG. 4A is a top view schematic of a high-performance 17 µm pitch or smaller CNT/graphene-based microbolometer array 400 on Si wafer substrate 410. The two side contacts connections 420 adjoining the graphene/CNT microbridge sensing element (e.g., CNT or graphene layer on a VOx layer on a Si3N4 channel 430) provide electrical addressing of each microbolometer pixel featuring VOx and Si$_3$N$_4$ layers. As shown, the microbolometer 400 can include either a CNT or graphene layer on a VOx layer on a Si3N4 channel 430, as will be described with respect to FIGS. 4B-C. The microbolometer array 400 can also include a plurality of insulated supports/connections 420 for readout of the pixel graphene/sensing elements in the array. The configuration, as described below, allows a thermal time constant for 17 µm pitch arrays of below 10 ms, less than half that of current VOx microbolometer pixels.

FIG. 4B is a cross-sectional view of a CNT-based microbolometer, featuring layer of CNTs grown on layer of VOx, deposited in turn on Si$_3$N$_4$ bridge layer on a Si substrate. As shown, a Si substrate 430 is provided. On top of the substrate 430 is a Si3N4 bridge layer 440 having a thickness of approximately 100 nm. On top of the Si3N4 bridge layer 440 is a VOx layer 450 having a thickness of approximately 250-500 nm. On top of the VOx layer 450 is a layer of CNTs (460). Each of the CNTs forming layer (460) can be randomly situated (e.g., unaligned) and can have a thickness of 2 nm.

In some examples, the VOx layer 450 can have a thickness of approximately 200 nm, i.e., 200 nm+/−5% depending on manufacturing tolerances. The VOx layer 450 can also have a ratio of oxygen to vanadium (O/V) in the range of 1.8 and 1.9. This O/V ratio can be achieved according to a DC sputtering technique described below.

The thin film layer of VOx can be deposited according to a DC (direct current) sputtering technique. The sputtering technique can include providing a vanadium target. Next, the vanadium target can be bombarded with ionized gas molecules. In this example, ionized gas particles can be provided at an 18:2 argon to oxygen gas flow ratio to allow control and variability of oxygen to vanadium (O/V) concentration in order to achieve the range of 1.8 to 1.9 O/V described above. When the vanadium target is bombarded with the ionized gas molecules, the vaporized atoms are subsequently condensed onto the Si substrate as the VOx thin film layer.

In some examples, the Si substrate 430 can have a (100) crystal orientation, according to Miller index notation, and can have a singled polished side (the side opposite the side on which the VOx is deposited). The Si substrate can have a low resistivity in the range of 0.001 Ohm-cm to 0.005 Ohm-cm. The Si substrate can have a diameter of at least 100 mm and a thickness of approximately 500 micrometers.

The substrate can include a top layer (e.g., on which the VOx is deposited) of deposited dry oxide SiO2 having thickness between 200 to 300 nm, and in one particular example a thickness of 285 nm.

FIG. 4C is a cross-sectional view of a graphene-based microbolometer, featuring layer of graphene on layer of VOx, grown on $Si_3N_4$ bridge layer on a Si substrate. As shown, a Si substrate 465 is provided. On top of the substrate 465 is a Si3N4 bridge layer 470 having a thickness of approximately 100 nm. On top of the Si3N4 bridge layer 470 is a VOx layer 475 having a thickness of approximately 250-500 nm. On top of the VOx layer 475 is a layer of graphene 480. The layer of graphene 480 can be a single layer (e.g. monolayer) having a thickness of 0.34 nm.

In some examples, the VOx layer 475 can have a thickness of approximately 200 nm, i.e., 200 nm+/−5% depending on manufacturing tolerances. The VOx layer 475 can also have a ratio of oxygen to vanadium (O/V) in the range of 1.8 and 1.9. This O/V ratio can be achieved according to a DC sputtering technique described below.

The thin film layer of VOx can be deposited according to a DC (direct current) sputtering technique. The sputtering technique can include providing a vanadium target. Next, the vanadium target can be bombarded with ionized gas molecules. In this example, ionized gas particles can be provided at an 18:2 argon to oxygen gas flow ratio to allow control and variability of oxygen to vanadium (O/V) concentration in order to achieve the range of 1.8 to 1.9 O/V described above. When the vanadium target is bombarded with the ionized gas molecules, the vaporized atoms are subsequently condensed onto the Si substrate as the VOx thin film layer.

In some examples, the Si substrate 465 can have a (100) crystal orientation, according to Miller index notation, and can have a singled polished side (the side opposite the side on which the VOx is deposited). The Si substrate can have a low resistivity in the range of 0.001 Ohm-cm to 0.005 Ohm-cm. The Si substrate can have a diameter of at least 100 mm and a thickness of approximately 500 micrometers. The substrate can include a top layer (e.g., on which the VOx is deposited) of deposited dry oxide SiO2 having thickness between 200 to 300 nm, and in one particular example a thickness of 285 nm.

The examples of FIGS. 4A-C advantageously provide a microbolometer structure/array that achieve a TCR in the range of 3%/K to 5%/K TCR and 1/f noise Hooge parameter $\alpha_H/p \approx 1 \times 10-24$ cm3, enabling a noise equivalent temperature difference (NETD) below 25 mK for 17 μm pitch and 12 μm LWIR focal plane arrays. In one example, this can be achieved in the 1-10 kHz range.

Figure 5:
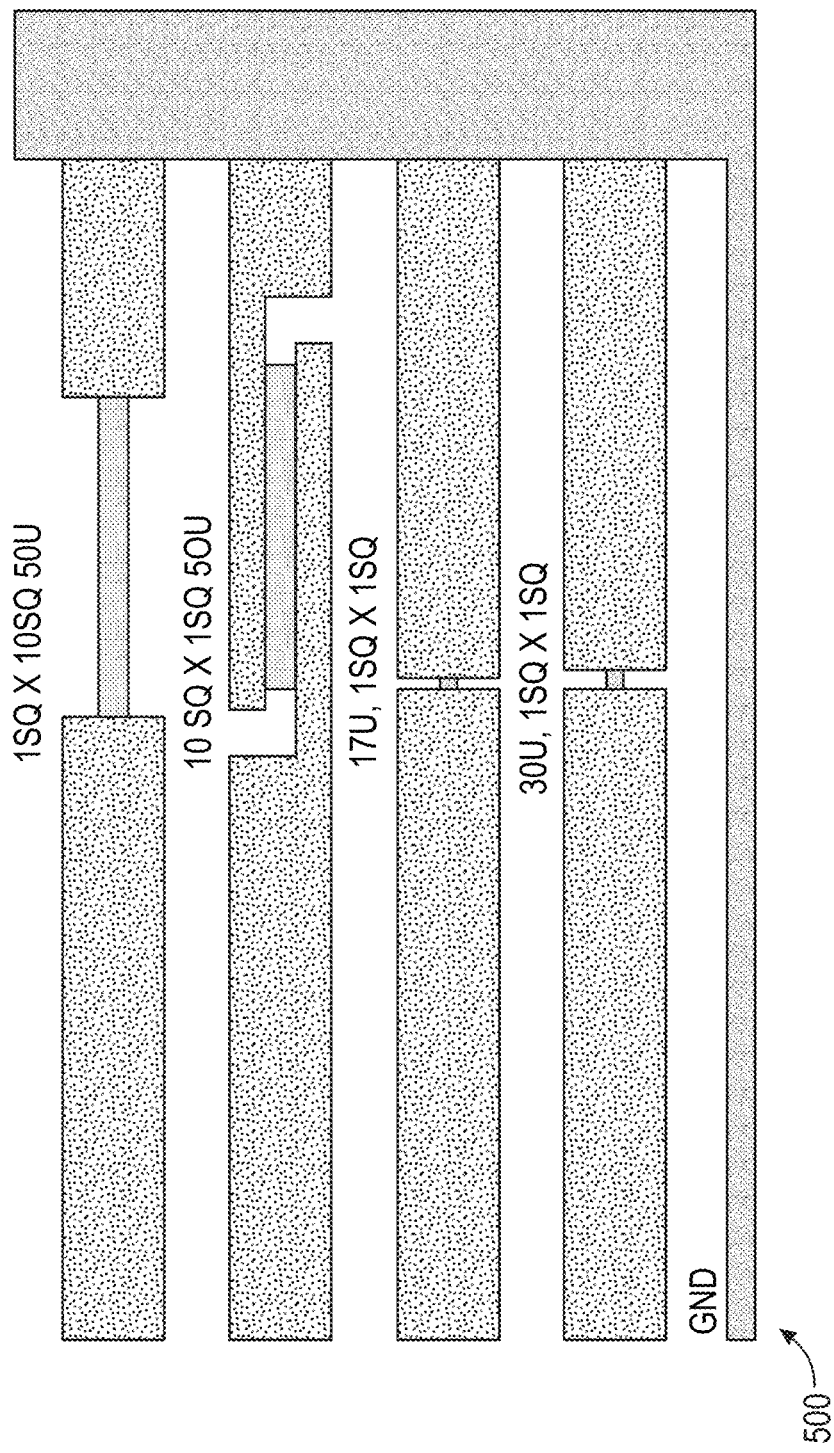
FIG. 5 depicts a test structure to evaluate the CNT and graphene film characterization.
Figure 6:
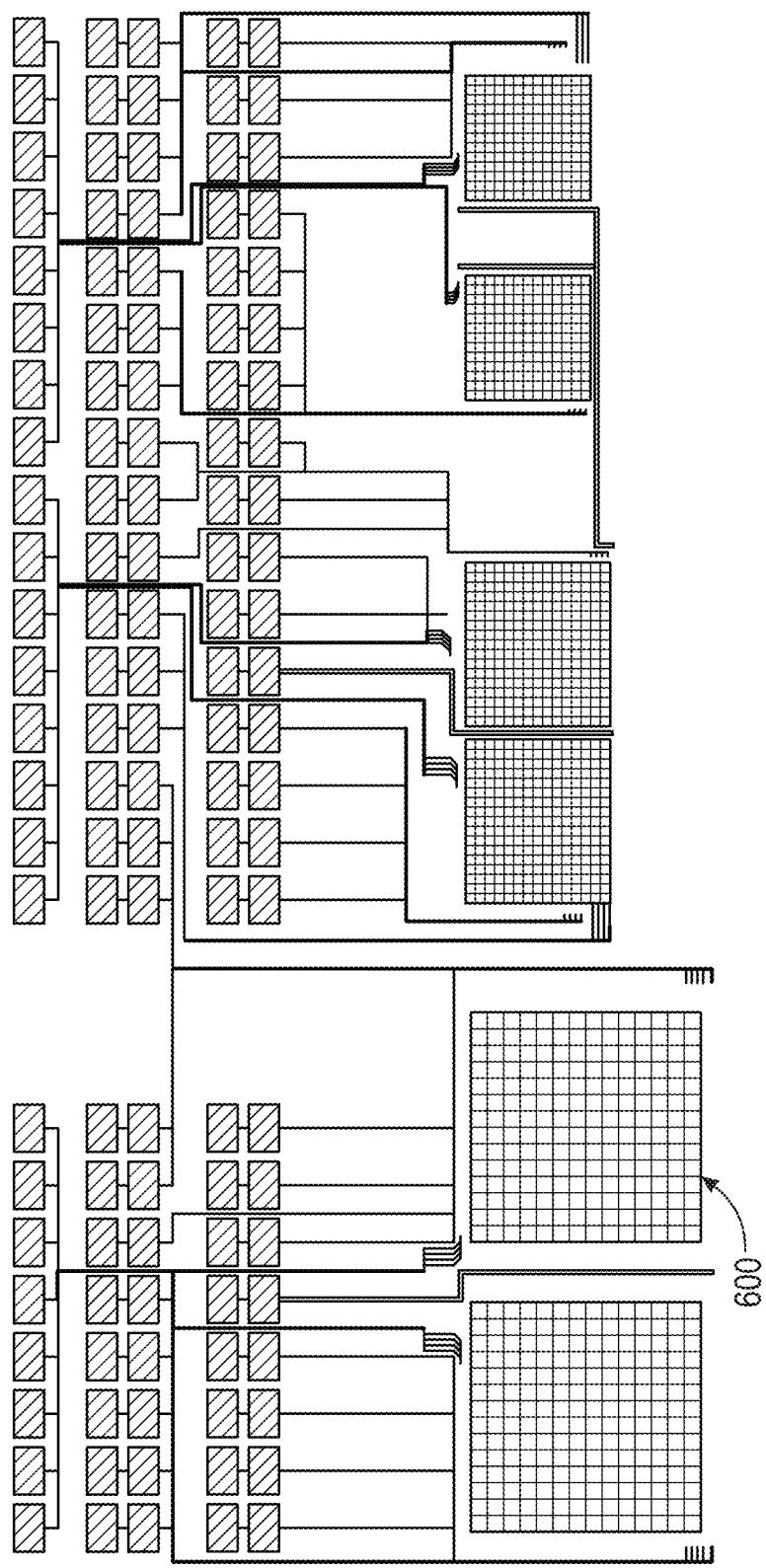
FIG. 6 is a test structure to evaluate the VOx, CNT, and graphene film characterization.

In order to measure devices over a broad resistance range and to evaluate surface effects and contact resistance, resistor structures are characterized with varying aspect ratios as shown in 500 and 600 in FIG. 5 and FIG. 6. Resistance, TCR, and noise measurements are performed with the samples placed in a dark, cold-shielded cryostat to ensure isothermal measurements with the sample in thermal equilibrium.

Sample resistance R(T) at various temperatures is obtained by recording the current-voltage (I-V) characteristics, determining the Ohmic region, and extracting the resistance. Contact resistance, drift, and thermal hysteresis effects are measured and analyzed. The TCR at a specific temperature T is experimentally obtained by numerical differentiation of the temperature dependence of the sample resistance R(T):

$$(TCR)_{T_i} = \frac{1}{R_i}\left\{\frac{dR}{dT}\right\}_i = \frac{1}{R_i}\left\{\frac{1}{2}\left(\frac{R_{i+1} - R_i}{T_{i+1} - T_i} + \frac{R_i - R_{i-1}}{\tau_i - \tau_{i-1}}\right)\right\} \quad (1)$$

Electrical transport in semiconductors is via band states or hopping in localized states. The temperature dependent conductivity, σ(T), generally follows the model:

$$(TCR)_{T_i} = \sigma_0 e^{-(T_0/T)^p} \quad (2)$$

where T0 is the characteristic temperature, T is the material temperature, and σo is the conductivity prefactor. The value of the exponent p depends on the details of the density of states (DOS) as affected by long range Coulomb interaction among the charge carriers. Strong Coulomb interaction results in a gap in the density of states, generally referred to as the Coulomb gap.

In such a case, p=½ and the conductivity is described by the Efros-Shklovskii Variable Range Hopping (VRH) model. If the Coulomb interaction is negligible, the conductivity follows the Mott VRH model and p=¼. In most materials the Coulomb gap is small, and Efros-Shklovskii type conductivity is observed at low temperature. For intermediate temperatures, there is a crossover from Efros-Shklovskii to Mott conduction, and, at high temperatures, both the Mott and Efros-Shklovskii transition to Nearest Neighbor Hopping (NNH) conduction where p=1.

For conduction via extended states the exponent is also p=1 and T0=E/kB, where E is the thermal activation energy and kB the Boltzmann constant.

In order to determine which conductivity mechanism dominates, a technique known as Resistance Curve Derivative Analysis (RCDA) method is used. In the RCDA method, the logarithmic conductivity data with temperature is numerically differentiated, where the quantity w is determined:

$$w(T) = \frac{d(\log\sigma)}{d(\log T)} = p\left(\frac{T_0}{T}\right)^p \quad (3)$$

The value p is obtained by the slope and the characteristic temperature T0 from the y-intercept when plotting:

$$\log w = -p \log T + \log p(T_0)^p \quad (4)$$

Figure 7:
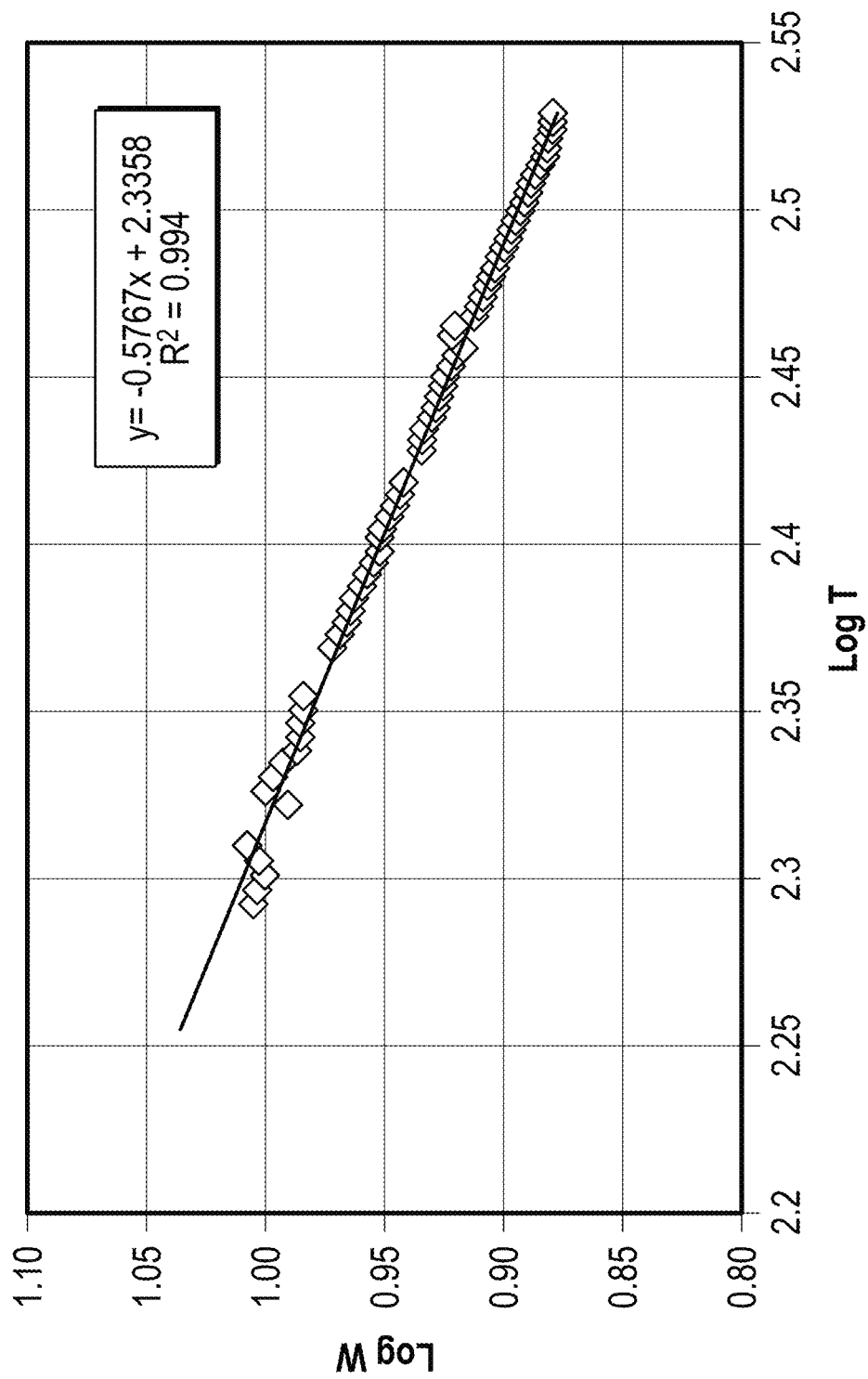
FIG. 7 is a plot depicting RCDA analysis of conductivity temperature dependence.

The conductivity prefactor σ0 can then be calculated from the conductivity expression. An example of the RCDA conductivity analysis is shown in FIG. 7. The exponent p=0.58 is indicative of Efros-Shklovskii VRH conduction, where p=½. The characteristic temperature is T0=8.24×104 K, and the conductivity prefactor is σ0=1.06×106 (Ω·cm)−1.

The TCR depends on the conductivity regime described by Eq. (3) and specified by p and the characteristic temperature T0 in that regime, as shown by Eq. (5):

$$|TCR| = \left|\frac{1}{R}\frac{dR}{dT}\right| = \left|\frac{1}{\sigma}\frac{d\sigma}{dT}\right| = p\frac{T_0^p}{T^{p+1}} \quad (5)$$

The temperature dependence of conductivity is measured and the TCR and hopping parameters p, σ0, and T0 are determined and tracked as a function of film structure, deposition conditions, and postdeposition processing.

Figure 8:
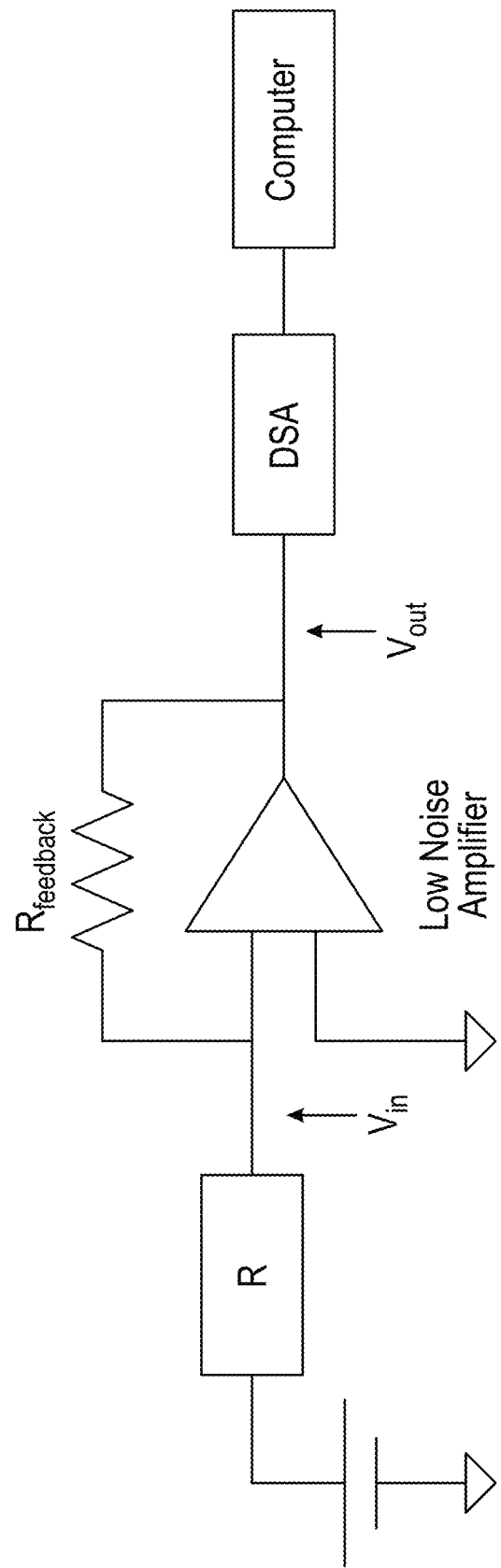
FIG. 8 is a Schematic of apparatus used for noise measurements.

A schematic of the noise measurements is shown in FIG. 8. The measured noise Vm is:

$$V_m^2 = V_{R_{Feedback}}^2 + (GV_n)^2 \quad (6)$$

where VRFeedback is the Johnson noise of the amplifier feedback resistor, Vn is the sample noise, and G is the amplifier gain. The gain is the ratio of the amplifier output signal voltage Vout to the input signal voltage Vin, which is equal to the ratio of the feedback resistance to the sample resistance R:

$$G = \frac{V_{out}}{V_{in}} = \frac{R_{Feedback}}{R} \quad (7)$$

The system noise is also characterized by using metal film resistors whose resistances are comparable to the devices tested. Using the metal film resistor noise results, the low frequency noise of the cross-linked metal particles film noise and system noise can be quantified.

Experimental room temperature noise measurements are acquired in a shielded and light-tight enclosure. For temperature-dependent noise measurements, the film is mounted within a cryostat. All measurements are made with the films in dark conditions. The gain is adjusted by use of a variable feedback resistor within the preamplifier.

Generally, in semiconductors, the total noise measured is comprised of 1/f noise, white noise, and potentially generation-recombination (G-R) noise, which can be expressed quantitatively as:

$$\frac{V_{noise2}}{\Delta f} = \frac{V_{1/f}^2}{\Delta f} + \frac{V_{white}^2}{\Delta f} + \frac{V_{G-R}^2}{\Delta f} \quad (8)$$

The 1/f noise can be described using the Hooge model:

$$\frac{V_{1/f}^2}{\Delta f} = \frac{\alpha_H}{P} \frac{V_{Bias}^2}{f^\gamma} = \frac{\alpha_H}{pV} \frac{V_{Bias}^2}{f^\gamma} = \frac{B}{f^\gamma} \quad (9)$$

where $$B = \frac{\alpha_H}{pV} V_{Bias}^2 \quad (10)$$

and P is the total number of carriers, p is the carrier density, V is the device volume, VBias is the device bias, and γ is the frequency exponent typically near a value of 1 (in the range of 0.9 to 1.1). The normalized Hooge parameter is α_H/p, where is the Hooge coefficient. For the Hooge model:

$$\sqrt{B} \propto V_{Bias} \text{ and } B/V_{Bias}^2 \propto 1/V \text{ for fixed bias voltages} \quad (11)$$

The G-R noise for a single trap is described by:

$$\frac{V_{G-R}^2}{\Delta f} = \frac{A\tau V_{Bias}^2}{1+(2\pi\tau f)^2} \quad (12)$$

where τ is the trap time constant and A=n_t/(Vp^2). Here, $n_t$ is the trap density, V is the device volume, and p is the carrier density. The noise waveform can be analyzed for trapping by:

$$W \equiv f \frac{(V_{noise}^2 - V_{white}^2)}{V_{Bias}^2} = \frac{\alpha}{P} + \frac{fA_t\tau}{1+(2\pi\tau f)^2} \quad (13)$$

Here it is assumed that the exponent of the 1/f noise frequency is equal to 1. For the case of a single trap, a plot of $[f(V_{noise}^2-V_{white}^2)/V_{Bias}^2]V$ (determined from the measured noise data) yields a horizontal line (of value α_H/P) superimposed with a Lorentzian (trap).

Figure 9:
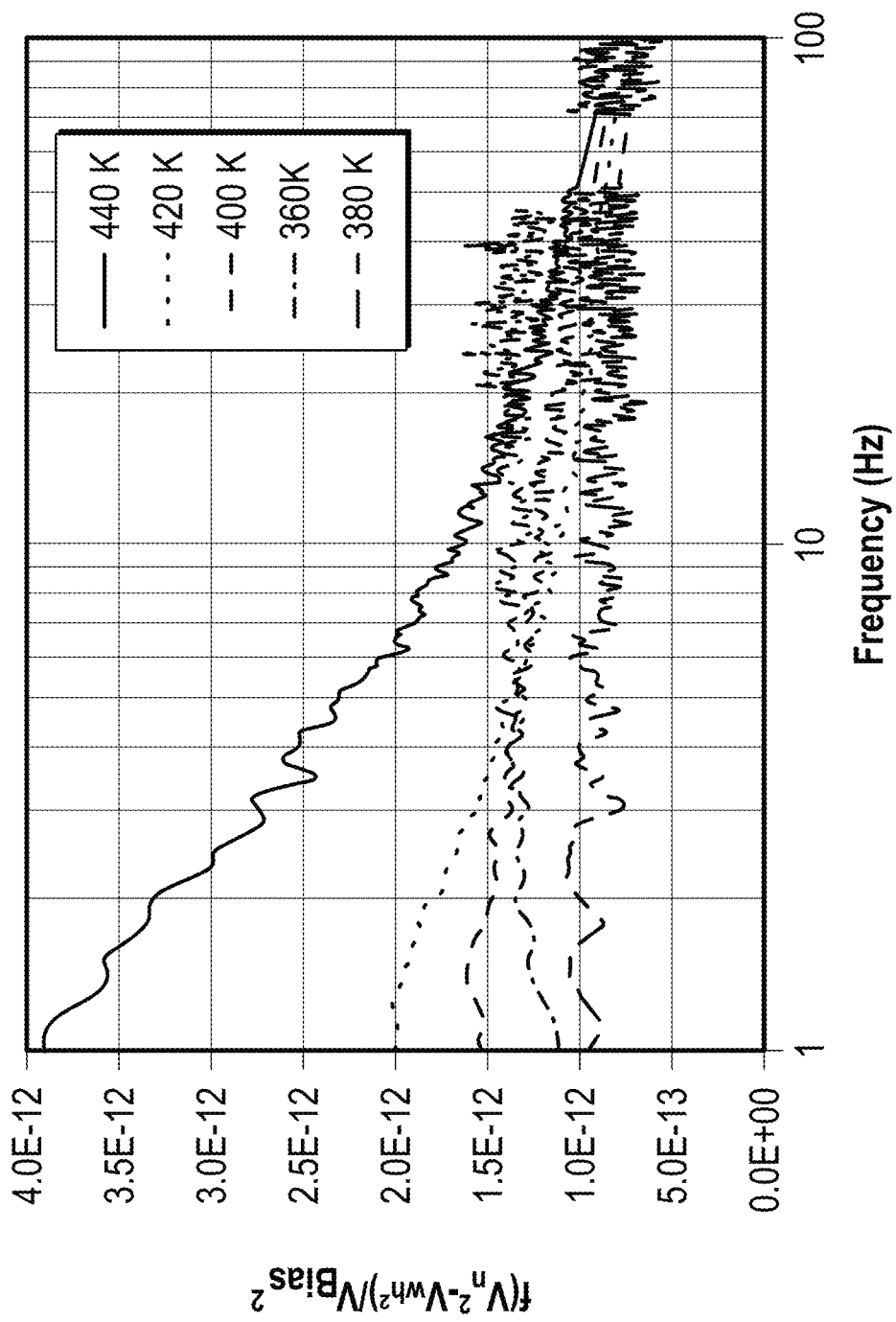
FIG. 9 is a graph depicting normalized waveforms analyzed for trapping at various temperatures.

FIG. 9 shows an example of W plot as a function of frequency for noise data taken at different temperatures. For temperatures of 360 K and 380 K, the curves have no slope, indicative that the measured low frequency noise is 1/f noise only. The values of these curves are equal to α_HT. For temperatures 400 K and above, the curves at low frequency (less than 10 Hz) increase with increasing temperature.

The temperature dependence of VOx/CNT films with varying packing densities of CNTs into the VOx is measured and analyzed to determine the conduction mechanism and to optimize and control resistivity, TCR, and noise.

A baseline of microbolometer performance for VOx, CNT and Graphene based devices to model their expected performance is the Figure of Merit (FOM) of microbolometer imaging devices, which at the pixel level is:

$$FOM=NETD\times\tau_{th} \quad (14)$$

where the Noise Equivalent Temperature Difference (NETD) and thermal time constant τ_th are described by Eq. (15) and Eq. (16), respectively:

$$NETD = \frac{1}{\frac{1}{4F^2+1}\frac{dP_s}{dT_s}} \frac{G_{th}}{\eta A_D} \frac{V_{noise}}{TCR \cdot V_{Bias.}} \quad (15)$$

$$\tau_{th} = \frac{C_p m}{G_{th}} \quad (16)$$

(The thermal time constant τ_th is measured by applying pulsed bias and measuring the pixel temperature rise and decay and monitoring the emitted infrared radiation with a fast LWIR detector.) The TCR, Vnoise, and heat capacity Cp are material parameters, whereas pixel mass m, pixel area AD, and thermal conductance Gth are device parameters. The absorptance η is a material parameter dependent on the material optical constants n+ik, and a device parameter dependent on the pixel resonant cavity design.

For a VOx-CNT or VOx-Graphene microbolometer design, the pixel material parameters to be modified by the addition of CNTs or Graphene are Vnoise and TCR. In the case that the dominant noise is 1/f, Eq. (15) becomes:

$$NETD = \frac{1}{\frac{1}{4F^2+1}\frac{dP_s}{dT_s}} \frac{G_{th}}{\eta A_D} \frac{1}{\sqrt{Vol\, f}} \frac{\sqrt{\frac{\alpha_H}{n}}}{TCR} \equiv S\frac{\sqrt{\frac{\alpha_H}{n}}}{TCR} \quad (17)$$

Figure 10:
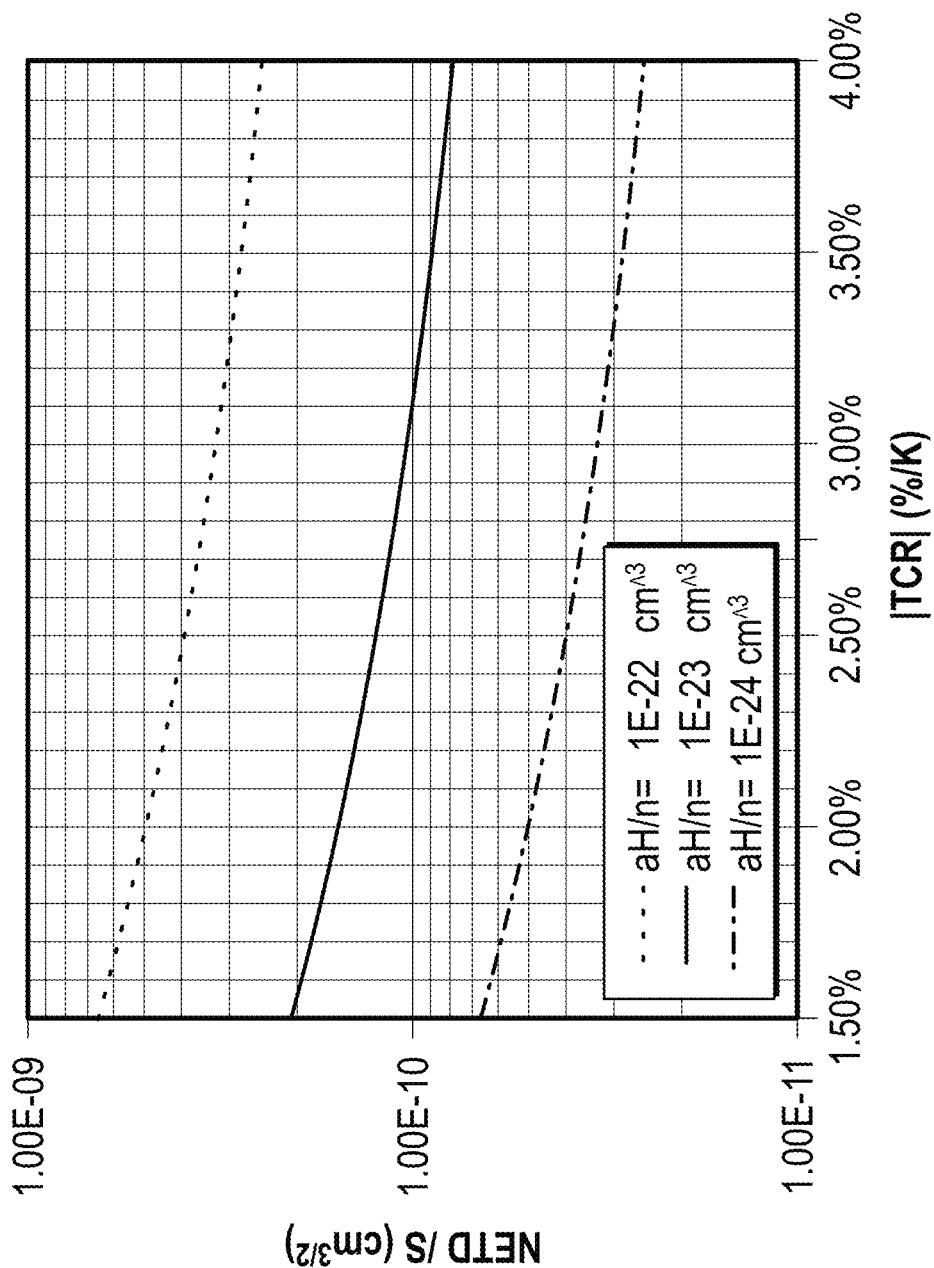
FIG. 10 is a graph depicting normalized NETD/S dependence on TCR and 1/f noise changes.

FIG. 10 shows that the NETD changes linearly with the square root of the normalized Hooge parameter αH/n, and inversely proportionally with TCR. The NETD/S ratio is shown for the expected range of αH/n, and TCR of a composite VOx pixel modified by the addition of CNTs or graphene.

TCR values reported for CNT based microbolometers with different architectures vary in the range of 0.14%/K to 2.94%/K. These values are comparable to the TCRs of VOx films. CNTs and/or graphene can form composite films with VOx by deposition on the surface of a VOx film, or by incorporation into the VOx film.

Placing CNTs on the surface of VOx films will modify the conductivity and TCR of the composite structure according to the conductivities of the VOx and CNT layers:

$$\sigma_{tot} = \sigma_{VOx} + \sigma_{CNT} \quad (18)$$

$$|TCR|_{tot} = \frac{\sigma_{VOx}}{\sigma_{VOx} + \sigma_{ES}}|TCR|_{VOx} + \frac{\sigma_{CNT}}{\sigma_{VOx} + \sigma_{CNT}}|TCR|_{CNT} \quad (19)$$

where σVOx is the initial VOx film conductivity and σCNT is the initial CNT overlayer conductivity.

The VOx and CNT films are assumed to be noninteracting and conducting in parallel. The CNT conductivity and TCR vary with the CNT packing density of the CNT film structure, and consequently the conductivity and TCR of the composite VOx-CNT film will vary with the CNT packing density. When CNTs are incorporated in a VOx film, the composite film conductivity and TCR depends on the various conduction paths, i.e., VOx conduction, VOx to CNT conduction, or CNT to CNT conduction. The predominant conduction pathway depends on the CNT packing density in the VOx film.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Accordingly, this description is meant to be taken only by way of example, and not to otherwise limit the scope of this invention.

What is claimed is:

1. A microbolometer structure, consisting essentially of:
   a Si substrate;
   a Si3N4 bridge layer;
   a VOx layer; and
   a layer of CNTs or a layer of graphene.

2. The microbolometer structure of claim 1, wherein the Si substrate has a thickness of approximately 500 micrometers.

3. The microbolometer structure of claim 1, wherein the Si substrate has a (100) crystal orientation according to a Miller index notation.

4. The microbolometer structure of claim 1, wherein the Si substrate includes a top layer of dry oxide SiO2 having a thickness between 200 nm to 300 nm.

5. The microbolometer structure of claim 1, wherein the Si3N4 bridge layer has a thickness of approximately 100 nm.

6. The microbolometer structure of claim 1, wherein the VOx layer has a thickness of approximately 200 nm.

7. The microbolometer structure of claim 1, wherein the VOx layer has a ratio of oxygen to vanadium (O/V) in the range of 1.8 and 1.9.

8. The microbolometer structure of claim 1, wherein the VOx layer is deposited using a DC sputtering technique having a 18:2 argon to oxygen gas flow ratio.

9. The microbolometer structure of claim 1, wherein the layer of CNTs or the layer of graphene comprises the layer of CNTs.

10. A microbolometer structure, comprising:
    a Si substrate;
    a Si3N4 bridge layer;
    a VOx layer; and
    a layer of CNTs or a layer of graphene,
    wherein the Si substrate has a resistivity in the range of 0.001 Ohm-cm to 0.005 Ohm-cm.

11. The microbolometer structure of claim 10, wherein the Si substrate has a thickness of approximately 500 micrometers.

12. The microbolometer structure of claim 10, wherein the Si substrate has a (100) crystal orientation according to a Miller index notation.

13. The microbolometer structure of claim 10, wherein the Si3N4 bridge layer has a thickness of approximately 100 nm.

14. The microbolometer structure of claim 10, wherein the VOx layer has a thickness of approximately 200 nm.

15. The microbolometer structure of claim 10, wherein the VOx layer has a ratio of oxygen to vanadium (O/V) in the range of 1.8 and 1.9.

16. The microbolometer structure of claim 10, wherein the VOx layer is deposited using a DC sputtering technique having a 18:2 argon to oxygen gas flow ratio.

17. The microbolometer structure of claim 10, wherein the layer of CNTs or the layer of graphene comprises the layer of CNTs.

18. A microbolometer structure, comprising:
    a Si substrate;
    a Si3N4 bridge layer;
    a VOx layer; and
    a layer of CNTs or a layer of graphene,
    wherein the top layer of dry oxide SiO2 has a thickness of 285 nm.

19. A microbolometer structure, comprising:
    a Si substrate;
    a Si3N4 bridge layer;
    a VOx layer; and
    a layer of CNTs or a layer of graphene,
    wherein the layer of CNTs are unaligned and has a thickness of 2 nm.

20. A microbolometer structure, comprising:
    a Si substrate;
    a Si3N4 bridge layer;
    a VOx layer; and
    a layer of CNTs or a layer of graphene,
    wherein the layer of CNTs or the layer of graphene comprises the layer of graphene, and
    wherein the layer of graphene is a single layer having a thickness of 0.34 nm.

* * * * *